(12) United States Patent
Moulds et al.

(10) Patent No.: US 8,614,417 B2
(45) Date of Patent: Dec. 24, 2013

(54) CAPACITOR ASSEMBLY FOR A MASS SPECTROMETER

(75) Inventors: Richard Moulds, Stockport (GB); Kenneth R. Worthington, Cheshire (GB); Eliot Powell, Staffordshire (GB)

(73) Assignee: Waters Technologies Corporation, Milford, MA (US)

( * ) Notice: Subject to any disclaimer, the term of this patent is extended or adjusted under 35 U.S.C. 154(b) by 0 days.

(21) Appl. No.: 13/703,912

(22) PCT Filed: Jul. 11, 2011

(86) PCT No.: PCT/GB2011/051293
§ 371 (c)(1),
(2), (4) Date: Feb. 19, 2013

(87) PCT Pub. No.: WO2012/004613
PCT Pub. Date: Jan. 12, 2012

(65) Prior Publication Data
US 2013/0200260 A1    Aug. 8, 2013

Related U.S. Application Data

(60) Provisional application No. 61/372,987, filed on Aug. 12, 2010, provisional application No. 61/372,982, filed on Aug. 12, 2010.

(30) Foreign Application Priority Data

Jul. 9, 2010  (GB) .................. 1011569.9

(51) Int. Cl.
*H01J 49/24*  (2006.01)
(52) U.S. Cl.
CPC ..................... *H01J 49/24* (2013.01)
USPC ...................................... 250/281

(58) Field of Classification Search
USPC ................................. 250/281, 282
See application file for complete search history.

(56) References Cited

U.S. PATENT DOCUMENTS

| | | |
|---|---|---|
| 5,665,966 A | 9/1997 | Dahl et al. |
| 6,081,415 A | 6/2000 | Crawford et al. |
| 7,161,142 B1 | 1/2007 | Patterson et al. |
| 8,455,815 B2 * | 6/2013 | Steiner et al. ............. 250/283 |

FOREIGN PATENT DOCUMENTS

WO    01/75935 A1    10/2001

OTHER PUBLICATIONS

PCT International Search Report and Written Opinion for PCT/GB2011/051293, Forms PCT/ISA/210,220 and 237, dated Dec. 6, 2011, 9 pages.

* cited by examiner

*Primary Examiner* — Kiet T Nguyen
(74) *Attorney, Agent, or Firm* — Waters Technologies Corporation

(57) ABSTRACT

A capacitor assembly (1) for measuring the level of radio frequency voltage in a mass spectrometer. The assembly (1) includes an RF sensing capacitor (2) with first and second capacitor plates (3, 4), a rectifying circuit (5) and a vacuum housing feedthrough (6), all of which are mounted within a vacuum enclosure of the mass spectrometer. The first capacitor plate (3) is adapted for connection to a voltage source and mounted within the enclosure by first insulating spacers (31). The second capacitor plate (4) is nested within the first insulating spacers (31) and mounted within the enclosure by second insulating spacers (41). The rectifying circuit (5) is electrically connected to the second capacitor plate (4) and to the vacuum housing feedthrough (6).

19 Claims, 2 Drawing Sheets

CAPACITOR ASSEMBLY FOR A MASS SPECTROMETER

CROSS REFERENCE TO RELATED APPLICATIONS

This application is the National Stage of International Application No. PCT/GB2011/051293, filed on Jul. 11, 2011, which claims priority to and benefit of United Kingdom Patent Application No. 1011569.9, filed Jul. 9, 2010; United Kingdom Patent Application No. 1011564.0, filed Jul. 9, 2010; U.S. Provisional Patent Application Ser. No. 61/372,987, filed on Aug. 12, 2010; and U.S. Provisional Patent Application Ser. No. 61/372,982, filed on Aug. 12, 2010. The contents and teachings of each of these applications are hereby expressly incorporated herein by reference in their entirety.

This invention relates generally to capacitor assemblies and more particularly to capacitor assemblies for mass spectrometers. More specifically, although not exclusively, this invention relates to a capacitor assembly for measuring the RF amplitude of a mass spectrometer.

Mass spectrometers are instruments for analysing the chemical composition of matter, usually by using electric or magnetic fields to separate ionized particles by their mass-to-charge ratio. For example, in a quadrupole mass spectrometer the separation is achieved by driving two pairs of electrodes, wherein one pair is driven with a selected radio frequency RF voltage summed with a positive direct current (DC) voltage and the other pair is driven with the 180° out-of-phase RF signal summed with a negative DC voltage.

Accurate measurements of the level of RF voltage driving the electrodes is vital to the success of mass spectrometers, both to provide feedback to the RF circuit to ensure that it is maintained at the desired level and to provide the information to the DC control circuit to ensure that the desired ratio of RF to DC voltage is maintained.

Detector capacitors are used to detect the input RF voltage applied to the pairs of electrode rods and provide an output current that is representative of the input RF voltage. The output current is applied to RF and DC control circuits that control the RF and DC applied to the quadrupole.

A number of inherent stability issues arise when capacitors are used to measure RF amplitude. It is inevitable that environmental conditions will fluctuate for a number of reasons. For example, heat sources that vary with time include RF dielectric heating or even ambient temperature. An increase in temperature causes the capacitor plates to expand and the spacing between the capacitor plates to increase. A change in humidity causes the permittivity of the air gap between the plates to change. Humidity also causes other effects (e.g. surface effects) that affect capacitance and increase the temperature coefficient of the capacitor. Other measurement problems arise from further parasitic (unwanted) capacitance and inductance of wiring to the sensing capacitor, which affects the performance as a result of its own drift characteristics.

U.S. Pat. No. 6,424,515 discloses a capacitor arrangement that mitigates some of these issues, but not all of them, by mounting the capacitor to the wall of a vacuum enclosure and fluidly connecting the gap between the capacitor plates to the inside of the enclosure to provide a vacuum therebetween. However, this arrangement is still subject to many of the fluctuating environmental conditions mentioned above.

Accordingly, one aspect of the invention provides a capacitor assembly for measuring the level of radio frequency voltage in a mass spectrometer or in an ion trap, the assembly comprising a capacitor having first and second superposed capacitor plates mounted within a vacuum enclosure of a mass spectrometer and a vacuum housing feedthrough electrically connected to circuitry associated with the second plate, wherein the first capacitor plate is adapted for connection to a voltage source and the circuitry associated with the second capacitor plate includes a rectifier contained within the vacuum enclosure.

It will be appreciated that by rectifying the RF current within the vacuum chamber, the parasitic effects of the vacuum feedthrough and its associated wiring on the DC current used to measure the RF amplitude are reduced and/or minimised.

The first and/or second capacitor plate may be mounted within the vacuum enclosure by an insulating or isolating spacer, e.g. a respective insulating or isolating spacer.

A second aspect of the invention provides a capacitor assembly for measuring the level of radio frequency voltage in a mass spectrometer or in an ion trap, the assembly comprising a capacitor having a first capacitor plate adapted for connection to a voltage source and mounted within a vacuum enclosure of a mass spectrometer by a first insulating or isolating spacer, a superposed second capacitor plate adapted for connection to a rectifier and mounted within the vacuum enclosure by a second insulating or isolating spacer and a vacuum housing feedthrough electrically connected to circuitry associated with the second plate.

Mounting both the first and second capacitor plates within the vacuum enclosure of the mass spectrometer reduces significantly the density of the air and hence the water vapour contained therein. This greatly mitigates the aforementioned effects resulting from changes in environmental conditions.

Preferably, the capacitor assembly according to the second aspect of the invention comprises a rectifier connected to the second capacitor. More preferably, the rectifier is mounted within the vacuum enclosure.

The second capacitor plate and/or the second insulating or isolating spacer may be located or nested in or within the first insulating or isolating spacer. Alternatively, the first capacitor plate and/or the first insulating or isolating spacer may be located or nested in or within the second insulating or isolating spacer. This arrangement reduces the amount of dielectric in the highest field area, which reduces RF heating.

The first insulating or isolating spacer is preferably connected or secured to or adjacent a marginal or peripheral portion of the first capacitor plate. The second insulating or isolating spacer is preferably connected or secured to or adjacent a marginal or peripheral portion of the second capacitor plate. The first insulating or isolating spacer may comprise one or more, for example two or more, e.g. three or more, preferably four, spacer elements. The second insulating or isolating spacer may comprise one or more, for example two or more, e.g. three or more, preferably four, spacer elements. Each spacer element of the first insulating or isolating spacer may be connected or secured to or adjacent a respective marginal or peripheral portion of the first capacitor plate and/or each spacer element of the second insulating or isolating spacer may be connected or secured to or adjacent a respective marginal or peripheral portion of the second capacitor plate. For example, at least one or each spacer element may comprise an elongate element such as a rod or leg, which may comprise a curved, circular, square, rectangular, polygonal or other cross-section or cross-sectional shape. Additionally or alternatively, one or both spacers may comprise a spacer sleeve.

At least one, preferably both, of the insulating or isolating spacers comprises a suitable insulating material such as ceramic, quartz, fused silica and the like.

A third aspect of the invention provides rectifier circuit comprising one or more, e.g. two or more, capacitor assemblies as described above.

A fourth aspect of the invention provides a mass spectrometer vacuum enclosure comprising a capacitor assembly as described above.

A fifth aspect of the invention provides a mass spectrometer comprising a vacuum enclosure according to the third aspect of the invention and/or a capacitor assembly according to the first and/or second aspect of the invention.

Embodiments of the invention will now be described by way of example only with reference to the accompanying drawings in which.

Figure 1:
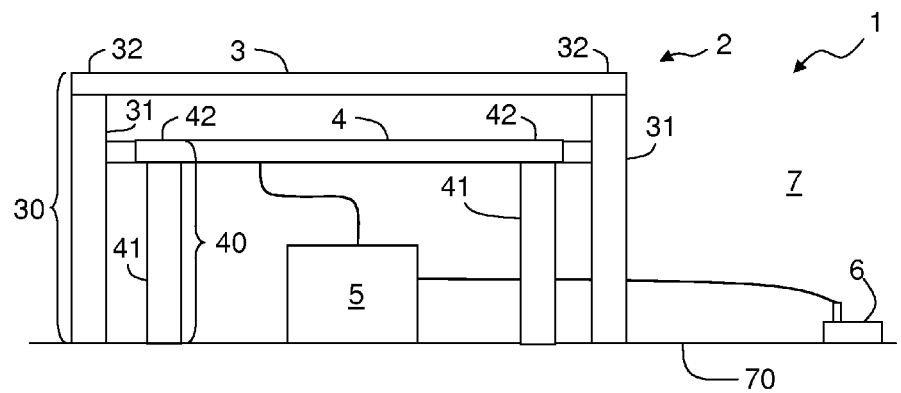
FIG. 1 is a schematic view of a capacitor assembly according to one embodiment of the invention.
Figure 2:
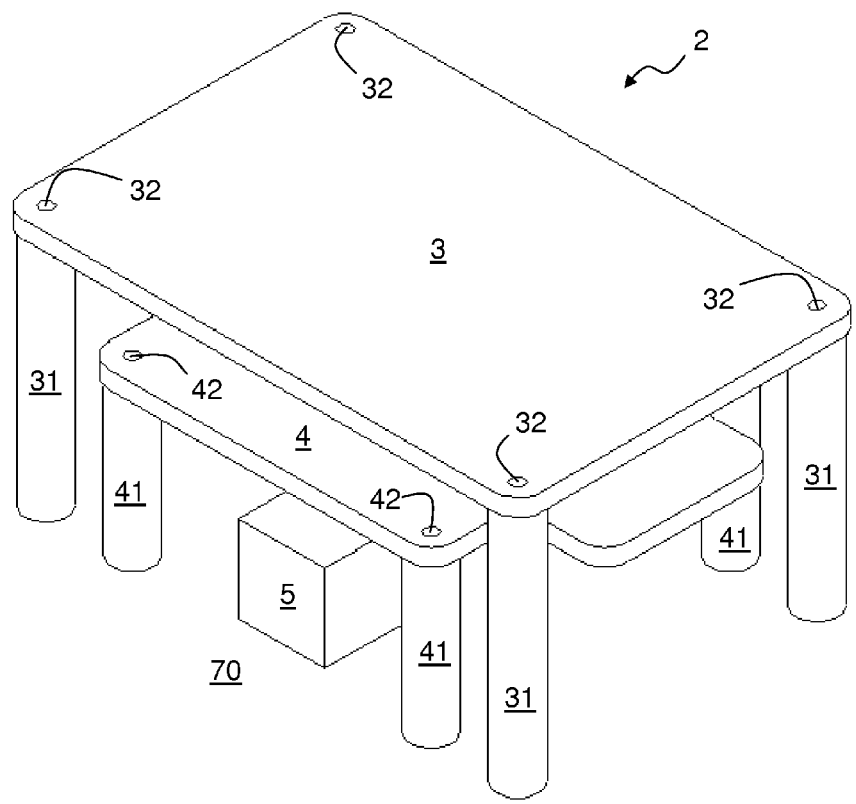
FIG. 2 is a perspective view of the capacitor assembly of FIG. 1 with the vacuum housing feedthrough omitted.
Figure 3:
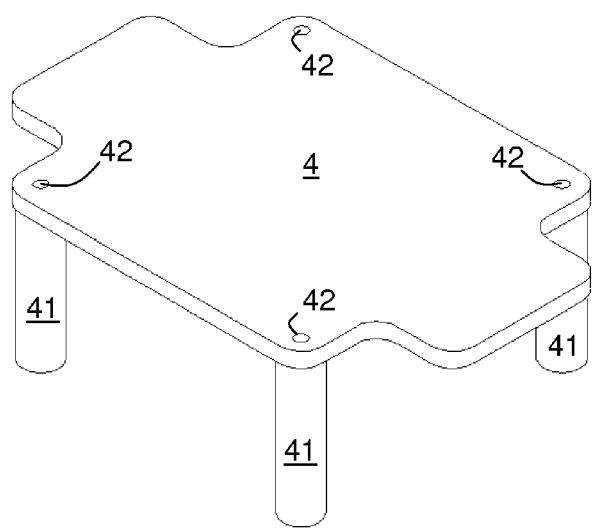
FIG. 3 is a perspective view of the second capacitor plate of the capacitor assembly of FIGS. 1 and 2.

Referring to FIGS. 1 to 3, there is shown a capacitor assembly 1 for measuring the level of radio frequency voltage in a mass spectrometer (not shown). The capacitor assembly 1 includes an RF sensing capacitor 2 with first and second capacitor plates 3, 4, and a rectifying circuit 5 electrically connected to the second capacitor plate 4 and to a vacuum housing feedthrough 6. All of the aforementioned components 1, 2, 3, 4, 5, 6 are mounted within a vacuum enclosure 7 of the mass spectrometer (not shown).

The first capacitor plate 3 is rectangular in plan with four rounded corners and is mounted to a wall 70 of the vacuum enclosure 7 by a first insulating or isolating spacer 30 in the form of four elongate first spacer elements 31. Each of the first spacer elements 31 has a circular cross-section and is connected adjacent to a respective corner of the first capacitor plate 3 by a fastener element 32. In this embodiment, the spacer elements 31 are made of a ceramic material.

Similarly, the second capacitor plate 4 is substantially rectangular in plan and is coextensive with the first capacitor plate 3, but with four scalloped corners to provide clearance for the first spacer elements 31 (shown more clearly in FIG. 2). The corners of the second capacitor plate 4 are also rounded. The second capacitor plate is mounted to the wall 70 of the vacuum enclosure 7 by a second insulating or isolating spacer 40 in the form of four elongate second spacer elements 41. Each of the second spacer elements 41 has a circular cross-section and is connected to a respective corner of the second capacitor plate 4 by a fastener element 42. In this embodiment, the spacer elements 41 are also made of a ceramic material.

The first and second capacitor plates 3, 4 are superposed, wherein the second capacitor plate 4 and its associated spacer elements 41 are nested within the spacer elements 31 of the first capacitor plate 3. The rectifying circuit 5 is located beneath the second capacitor plate 4 and is nested within the second spacer elements 41.

Figure 4:
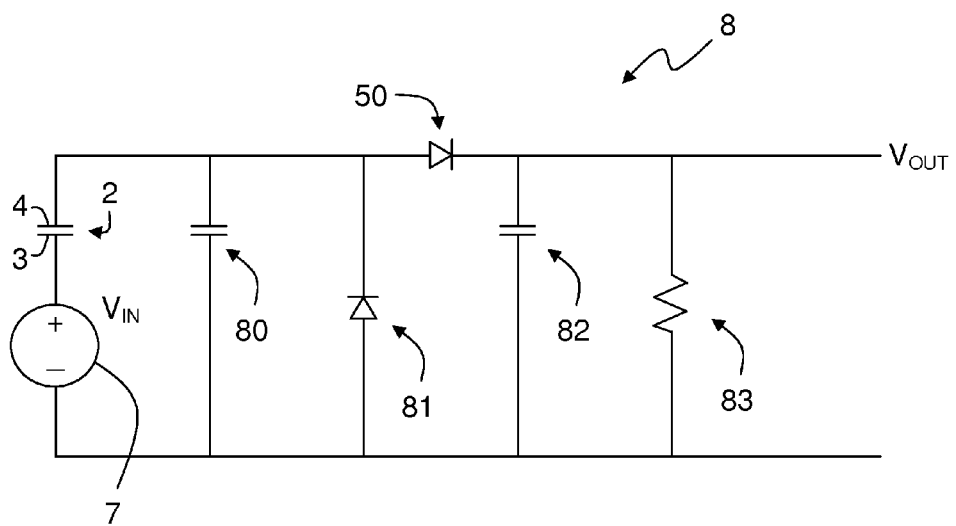
FIG. 4 is a circuit diagram illustrating the features of the capacitor assembly according to the capacitor assembly of FIGS. 1 to 3.

Referring now to FIG. 4, the first capacitor plate 3 of the capacitor is connected to a voltage source 7 and the second capacitor plate 4 is connected to a current rectifier 50. The circuit 8 also shows a parasitic capacitor 80 representing the parasitic capacitance found between the RF sensing capacitor 2 and the rectifier circuit, a second current rectifier 81, a filter capacitor 82 and a load resistor 83.

The current through the RF sensing capacitor 2 is proportional to the rate of change of the voltage across it (as the input voltage is typically very high and the output voltage small, this is approximately the rate of change of the voltage $V_{IN}$). During the rising portion of the input waveform, the current through the RF sensing capacitor 2 charges up the parasitic capacitor 80 until the current rectifier 50 is forward biased, after which point the current passes on into the filter capacitor 82 and the load resistor 83.

The current that passes into the filter capacitor 82 and the load resistor 83 causes a voltage at the circuit's output. The current held in the parasitic capacitor 80 does not. Thus the circuit's output current is proportional to the amplitude and frequency of the input voltage $V_{IN}$, less the current stored in the parasitic capacitor 80. It is clear that the larger the parasitic capacitance is, the more charge will be stored in the parasitic capacitor 80 for a given input voltage $V_{IN}$. Therefore, for a given input voltage $V_{IN}$ and frequency, varying the parasitic capacitance will cause the average value of $V_{OUT}$ to vary.

Given a steady input voltage $V_{IN}$ amplitude and frequency, the circuit will stabilise so that all the current passing through the current rectifier 50 passes through the load resistor 83. In this settled condition, the average output voltage $V_{OUT}$ is the product of the average output current and the load resistor 83. The filter capacitor 82 serves only to reduce the output voltage ripple; it has no effect on the average output voltage $V_{OUT}$.

By placing the rectifiers 50, 81 close to the sensor capacitor 2, the parasitic capacitance is minimised, since the associated wires are short. Long wires and feedthroughs after the rectifiers 50, 81 will increase the effective capacitance of the filter capacitor 82 and will not affect the average output voltage $V_{OUT}$. If the current was not rectified prior to the feedthrough or significant lengths of wiring, the output voltage $V_{OUT}$ would vary as the capacitance of the wiring or feedthroughs altered (due to temperature changes, physical movement and so forth).

It will be appreciated by those skilled in the art that several variations are envisaged without departing from the scope of the invention. For example, the second capacitor plate 4 may be configured such that the periphery of the first capacitor plate 3 extends beyond that of the second capacitor plate 4. It is also possible to configure the rectifier circuit to be fed by one or more, e.g. two or more capacitor assemblies 1.

Moreover, the spacers 30, 40 need not be in the form shown and/or at least one or each spacer element 31, 41 may be square, rectangular, polygonal or other cross-section or cross-sectional shape. Additionally or alternatively, one or both spacers 30, 40 may comprise a spacer sleeve. Additionally or alternatively, one or more of the spacers 30, 40 or spacer elements may comprise a different insulating material such as quartz, fused silica and the like.

It will also be appreciated by those skilled in the art that any number of combinations of the aforementioned features and/or those shown in the appended drawings provide clear advantages over the prior art and are therefore within the scope of the invention described herein.

The invention claimed is:

1. A capacitor assembly for measuring the level of radio frequency voltage in a mass spectrometer, the assembly comprising
   a capacitor having first and second superposed capacitor plates mounted within a vacuum enclosure of a mass spectrometer and a vacuum housing feedthrough electrically connected to circuitry associated with the second plate, wherein the first capacitor plate is adapted for connection to a voltage source and circuitry associated with the second capacitor plate includes a rectifier contained within the vacuum enclosure.

2. The capacitor assembly of claim 1, wherein at least one of the first capacitor place the second capacitor plate are mounted within the vacuum enclosure by an insulating spacer.

3. The capacitor assembly of claim 1, wherein each of the first and second capacitor plates is mounted within the vacuum enclosure by a first and a second insulating spacer respectively.

4. A rectifier circuit comprising one or more capacitor assemblies according to claim 1.

5. A rectifier circuit comprising two or more capacitor assemblies according to claim 1.

6. A mass spectrometer vacuum enclosure comprising a capacitor assembly according to claim 1.

7. A mass spectrometer comprising a vacuum enclosure according claim 6.

8. A mass spectrometer comprising a capacitor assembly according to claim 1.

9. A capacitor assembly for measuring the level of radio frequency voltage in a mass spectrometer, the assembly comprising a capacitor having a first capacitor plate adapted for connection to a voltage source and mounted within a vacuum enclosure of a mass spectrometer by a first insulating spacer, a superposed second capacitor plate adapted for connection to a rectifier and mounted within the vacuum enclosure by a second insulating spacer and a vacuum housing feedthrough electrically connected to circuitry associated with the second plate.

10. The capacitor assembly of claim 9, wherein the second capacitor plate is nested in the first insulating spacer.

11. The capacitor assembly of claim 9, wherein at least one insulating spacer is connected to a marginal portion of a respective capacitor plate.

12. The capacitor assembly of claim 11, wherein at least one of the insulating spacers comprises a plurality of spacer elements.

13. The capacitor assembly of claim 12, wherein each of the spacer elements is connected to a respective marginal portion of the respective capacitor plate.

14. The capacitor assembly of claim 13, wherein at least one of the insulating spacers comprises at least one of ceramic, quartz and/or fused silica.

15. A rectifier circuit comprising one or more capacitor assemblies according to claim 9.

16. A rectifier circuit comprising two or more capacitor assemblies according to claim 9.

17. A mass spectrometer vacuum enclosure comprising a capacitor assembly according to claim 9.

18. A mass spectrometer comprising a vacuum enclosure according claim 17.

19. A mass spectrometer comprising a capacitor assembly according to claim 9.

* * * * *